United States Patent
Lin et al.

(10) Patent No.: US 11,532,575 B2
(45) Date of Patent: Dec. 20, 2022

(54) INTEGRATED ANTENNA PACKAGE STRUCTURE AND MANUFACTURING METHOD THEREOF

(71) Applicant: Powertech Technology Inc., Hsinchu County (TW)

(72) Inventors: Han-Wen Lin, Hsinchu County (TW); Hung-Hsin Hsu, Hsinchu County (TW); Shang-Yu Chang Chien, Hsinchu County (TW); Nan-Chun Lin, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 578 days.

(21) Appl. No.: 16/562,442

(22) Filed: Sep. 6, 2019

(65) Prior Publication Data

US 2020/0328497 A1    Oct. 15, 2020

Related U.S. Application Data

(60) Provisional application No. 62/831,730, filed on Apr. 10, 2019.

(51) Int. Cl.
*H01L 23/66*    (2006.01)
*H01L 23/538*    (2006.01)
(Continued)

(52) U.S. Cl.
CPC .......... *H01L 23/66* (2013.01); *H01L 21/4853* (2013.01); *H01L 21/4857* (2013.01);
(Continued)

(58) Field of Classification Search
CPC . H01L 23/66; H01L 21/4853; H01L 21/4857; H01L 21/561; H01L 21/565;
(Continued)

(56) References Cited

U.S. PATENT DOCUMENTS 8,952,521 B2    2/2015  Wojnowski et al.
9,779,990 B2    10/2017 Huang et al.
(Continued)

FOREIGN PATENT DOCUMENTS

CN    107452721    12/2017
CN    108109984    6/2018
(Continued)

OTHER PUBLICATIONS

Office Action of China Counterpart Application, dated Oct. 18, 2021, pp. 1-9.
(Continued)

*Primary Examiner* — Daniel D Chang
(74) *Attorney, Agent, or Firm* — JCIPRNET

(57) ABSTRACT

An integrated antenna package structure including a chip, a circuit layer, an encapsulant, a coupling end, an insulating layer, a conductive connector, a dielectric substrate, and an antenna is provided. The circuit layer is electrically connected to the chip. The encapsulant is disposed on the circuit layer and covers the chip. The coupling end is disposed on the encapsulant. The insulating layer covers the coupling end. The insulating layer is not externally exposed. The conductive connector penetrates the encapsulant. The coupling end is electrically connected to the circuit layer by the conductive connection. The dielectric substrate is disposed on the encapsulant and covers the coupling end. The antenna is disposed on the dielectric substrate. A manufacturing method of an integrated antenna package structure is also provided.

19 Claims, 15 Drawing Sheets

(51) Int. Cl.
  *H01L 23/00*   (2006.01)
  *H01L 21/48*   (2006.01)
  *H01L 21/56*   (2006.01)
  *H01L 21/683*  (2006.01)
  *H01Q 1/22*    (2006.01)
  *H01L 23/31*   (2006.01)
  *H01L 25/10*   (2006.01)
  *H01L 25/00*   (2006.01)
  *H01L 21/78*   (2006.01)
  *H01L 23/552*  (2006.01)

(52) U.S. Cl.
  CPC .......... *H01L 21/561* (2013.01); *H01L 21/565* (2013.01); *H01L 21/568* (2013.01); *H01L 21/6835* (2013.01); *H01L 21/78* (2013.01); *H01L 23/3128* (2013.01); *H01L 23/5383* (2013.01); *H01L 23/5386* (2013.01); *H01L 23/5389* (2013.01); *H01L 23/552* (2013.01); *H01L 24/19* (2013.01); *H01L 24/20* (2013.01); *H01L 24/96* (2013.01); *H01L 25/105* (2013.01); *H01L 25/50* (2013.01); *H01Q 1/2283* (2013.01); *H01L 2221/68372* (2013.01); *H01L 2223/6677* (2013.01); *H01L 2224/214* (2013.01); *H01L 2224/95001* (2013.01); *H01L 2225/1035* (2013.01); *H01L 2225/1041* (2013.01); *H01L 2225/1058* (2013.01); *H01L 2924/3025* (2013.01); *H01L 2924/3511* (2013.01)

(58) Field of Classification Search
  CPC ... H01L 21/568; H01L 21/6835; H01L 21/78; H01L 23/3128; H01L 23/5383; H01L 23/5386; H01L 23/5389; H01L 23/552; H01L 24/19; H01L 24/20; H01L 24/96; H01L 25/105; H01L 25/50; H01L 2221/68372; H01L 2223/6677; H01L 2224/214; H01L 2224/95001; H01L 2225/1035; H01L 2225/1041; H01L 2225/1058; H01L 2924/3025; H01L 2924/3511; H01L 2221/68345; H01L 2221/68359; H01L 2224/04105; H01L 2224/12105; H01L 2224/1703; H01L 23/49822; H01L 2224/13082; H01L 2224/16225; H01L 2224/32225; H01L 2224/73204; H01L 2224/73259; H01L 2224/81005; H01L 2224/97; H01L 2924/15311; H01L 2924/15321; H01L 2924/181; H01L 24/97; H01L 25/16; H01L 21/56; H01L 23/3107; H01L 23/3121; H01Q 1/2283; H01Q 1/38; H01Q 1/50

See application file for complete search history.

(56) References Cited

U.S. PATENT DOCUMENTS

| | | | |
|---|---|---|---|
| 10,157,834 B1 | 12/2018 | Tang et al. | |
| 2018/0247905 A1* | 8/2018 | Yu | H01L 23/3114 |

FOREIGN PATENT DOCUMENTS

| | | | | |
|---|---|---|---|---|
| CN | 108511426 | | 9/2018 | |
| CN | 109309076 | | 2/2019 | |
| CN | 106129020 | | 4/2019 | |
| EP | 3091571 | A2 * | 11/2016 | ......... H01L 23/3128 |
| KR | 20180127144 | | 11/2018 | |
| TW | 201715670 | | 5/2017 | |
| TW | 201832343 | | 9/2018 | |
| TW | 201906233 | | 2/2019 | |

OTHER PUBLICATIONS

"Office Action of Taiwan Counterpart Application," dated Dec. 9, 2019, p. 1-p. 6.

* cited by examiner

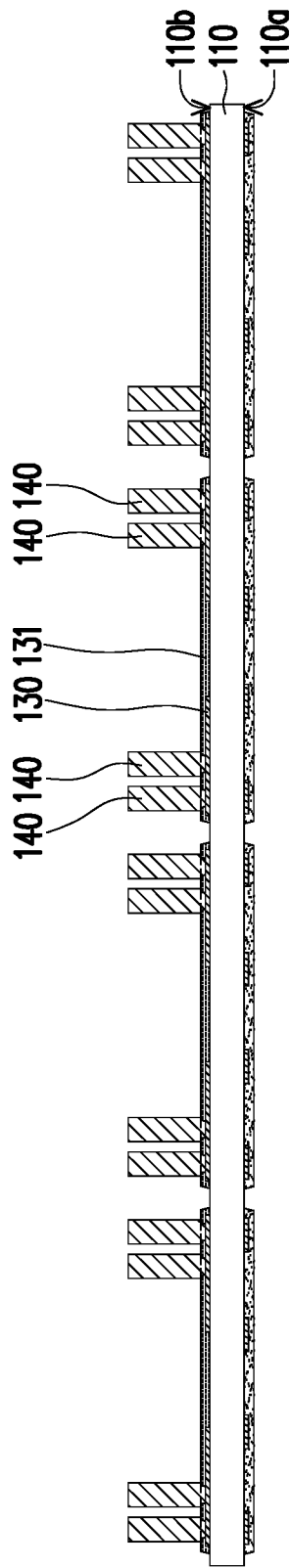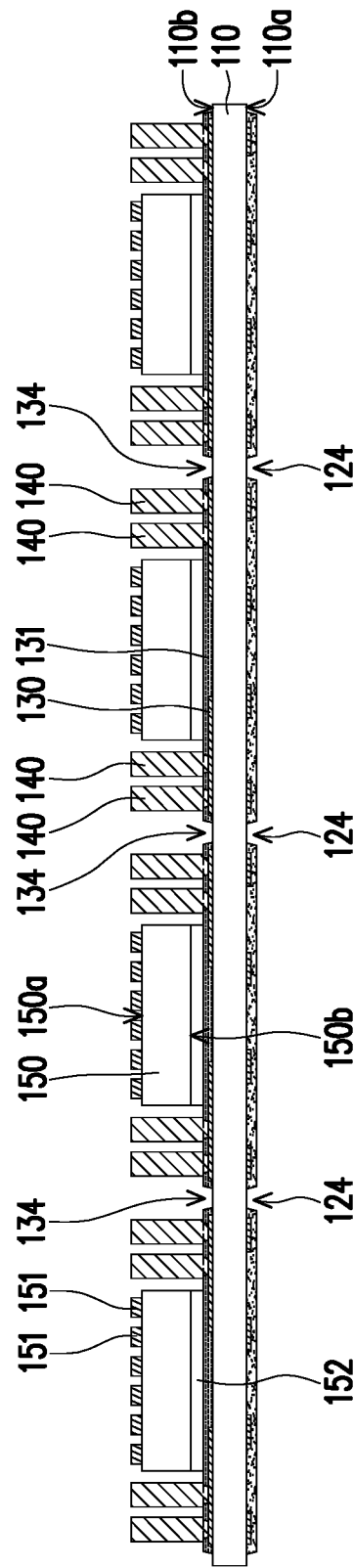

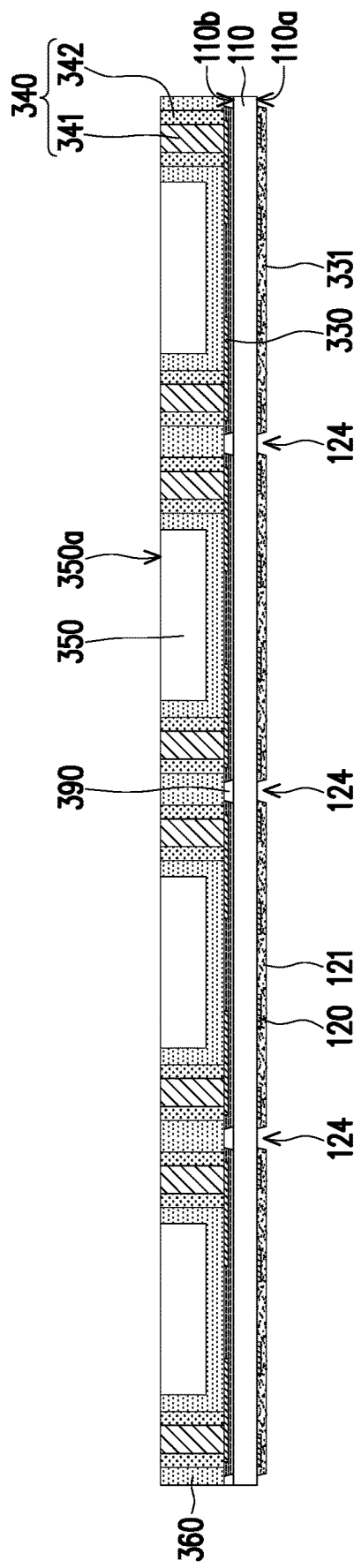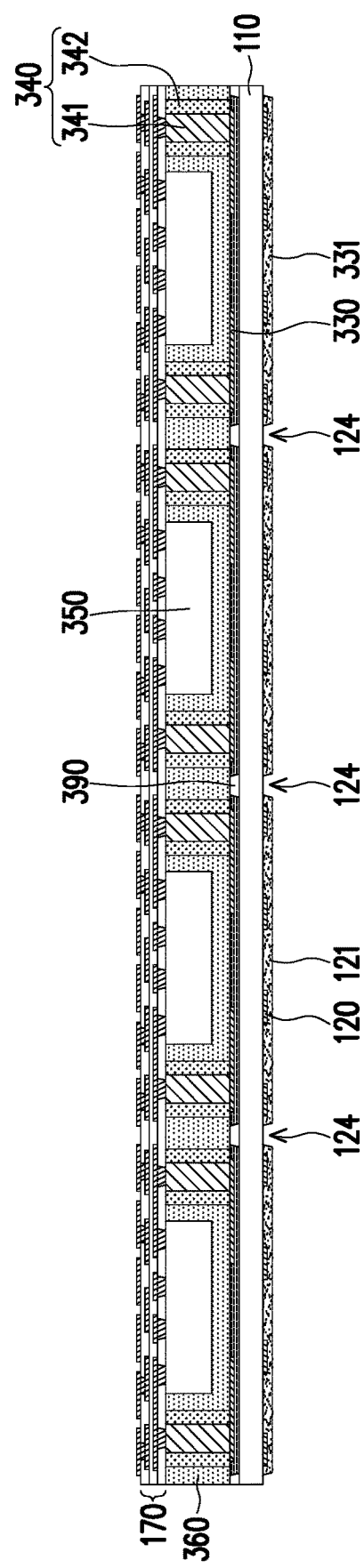

INTEGRATED ANTENNA PACKAGE STRUCTURE AND MANUFACTURING METHOD THEREOF

CROSS-REFERENCE TO RELATED APPLICATION

This application claims the priority benefit of U.S. provisional application Ser. No. 62/831,730, filed on Apr. 10, 2019. The entirety of the above-mentioned patent application is hereby incorporated by reference herein and made a part of this specification.

BACKGROUND

Technical Field

This invention relates to a package structure and a manufacturing method thereof, and in particular relates to an integrated antenna package structure and a manufacturing method thereof.

Description of Related Art

With the advancement of technology, the functions of electronic products are becoming more and more abundant. For example, in the current mobile communication device, in order to configure electronic components with different functions in one mobile communication device, the size of each electronic component is small for being possible to arrange all electronic components in the mobile communication device with the concept of light and thin.

The antenna in the existing electronic component is separated from the chip package structure, and the antenna needs to be electrically connected to the chip in the package structure by the circuit on the circuit board, so that the volume of the entire electronic component is difficult to be reduced.

SUMMARY

The invention provides an integrated antenna package structure and a manufacturing method thereof, which may have a smaller volume and a higher yield.

The integrated antenna package structure of the present invention comprises a chip, a circuit layer, an encapsulant, a coupling terminal, an insulating layer, a conductive connector, a dielectric substrate, and an antenna. The circuit layer is electrically connected to the chip. The encapsulant is disposed on the circuit layer and covers the chip. The antenna is disposed on the encapsulant. The insulating layer covers the antenna. The insulating layer is not exposed to the outside. The conductive connector penetrates through the encapsulant. The antenna is electrically connected to the circuit layer by the conductive connector. The dielectric substrate is disposed on the encapsulant and covers the antenna. The coupling terminal is disposed on the dielectric substrate.

A manufacturing method of an integrated antenna package structure comprises the following steps: providing a dielectric substrate, having a first surface and a second surface opposite to the first surface; forming a coupling terminal on the first surface of the dielectric substrate; forming an antenna on the second surface of the dielectric substrate; forming a conductive connector on the second surface of the dielectric substrate, wherein the conductive connector is electrically connected to the antenna; disposing a chip on the second surface of the dielectric substrate; forming an encapsulant on the second surface of the dielectric substrate, wherein the encapsulant covers the chip; and forming a circuit layer on the encapsulant, wherein the circuit layer is electrically connected to the chip and the conductive connector.

A manufacturing method of an integrated antenna package structure comprises the following steps: providing a carrier; forming a conductive connector on the carrier; disposing a chip on the carrier; forming an encapsulant on the carrier, wherein the encapsulant covers the chip and exposes the conductive connector; forming an antenna on the encapsulant and electrically connecting to the conductive connector; disposing a dielectric substrate on the antenna; forming a coupling terminal on the dielectric substrate; removing the carrier after the step of disposing the dielectric substrate; and forming a circuit layer electrically connected to the chip and the conductive connector after the step of removing the carrier.

Based on the above, the integrated antenna package structure a manufacturing method thereof may have a smaller volume and a higher yield.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 1A to FIG. 1G are schematic partial cross-sectional views of a partial manufacturing method of an integrated antenna package structure according to a first embodiment of the invention.

FIG. 3A to FIG. 3I are schematic partial cross-sectional views of a partial manufacturing method of an integrated antenna package structure according to a third embodiment of the invention.

DESCRIPTION OF THE EMBODIMENTS

Figure 1A:
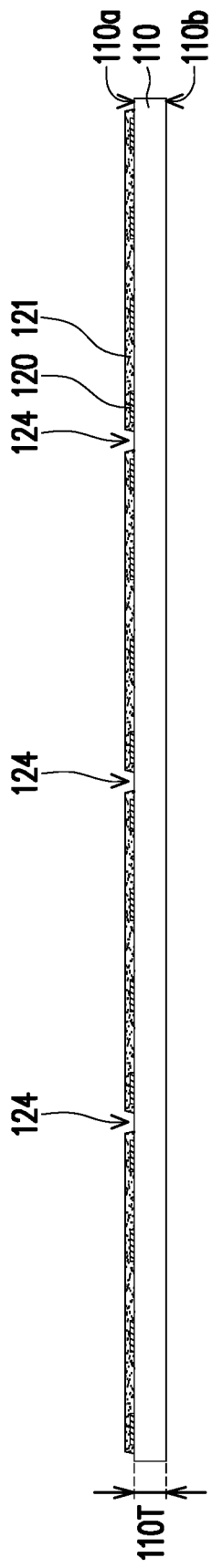

Herein, the directional terms (e.g., top, bottom, right, left, front, back) are merely used as a reference to the drawing and are not intended to imply the absolute orientation.

Unless otherwise expressly stated, any method described herein is not intended to be construed as performing its steps in a particular sequence.

The present invention will be described more fully with reference to the drawings of the embodiments. However, the invention may be embodied in various forms and should not be limited to the embodiments described herein. The thickness, dimension or size will be exaggerated for clarity. The same or similar reference numbers indicate the same or similar elements, and the following paragraphs are not be iterated herein.

FIG. 1A to FIG. 1G are schematic partial cross-sectional views of a partial manufacturing method of an integrated antenna package structure according to a first embodiment of the invention. FIG. 1H is a schematic partial cross-sectional view of an integrated antenna package structure according to a first embodiment of the invention.

Referring to FIG. 1A, a dielectric substrate 110 is provided. The dielectric substrate 110 has a first surface 110a and a second surface 110b. The second surface 110b is opposite to the first surface 110a.

In the embodiment, the dielectric substrate 110 is not particularly limited as long as the dielectric substrate 110 may be adapted to be carried an element disposed on or a film layer disposed on, and may be stably present in a temperature or temperature difference in a subsequent process. In addition, the dielectric substrate 110 may have a lower dielectric constant ($D_k$) and a lower dissipation factor ($D_f$) for penetrating electromagnetic signals.

In an embodiment, the material of the dielectric substrate 110 may be an inorganic material. The physical or chemical properties of the inorganic material may be stable.

In an embodiment, the dielectric substrate 110 may be a plate-shaped body, and the thickness 110T of the dielectric substrate 110 may be greater than 100 micrometers (μm). In other words, the dielectric substrate 110 may not be a film layer formed by evaporation, sputtering, deposition or coating process.

In an embodiment, the dielectric substrate 110 may be a homogeneous material, and the aforementioned homogeneous material may no longer be separated into different single materials by mechanical methods such as crushing, shearing, cutting, sawing, grinding, and the like. In other words, there may be no interface formed by different materials or different processes in the dielectric substrate 110.

In an embodiment, the material of the dielectric substrate 110 may include a silicate material. For example, the dielectric substrate 110 may be a glass substrate, a ceramic substrate, or a quartz substrate.

Referring to FIG. 1A, a coupling terminal 120 is formed on the first surface 110a of the dielectric substrate 110. The coupling terminal 120 may be formed by evaporation, sputtering, deposition, screen printing or other suitable process, and is not limited in the invention. In addition, the pattern of the coupling terminal 120 may be adjusted according to the design requirements, and is not limited in the present invention.

In the embodiment, the coupling terminal 120 may be in direct contact with the first surface 110a of the dielectric substrate 110. In general, the material of the coupling end 120 may be metal based on conductivity considerations.

In the embodiment, a cover layer 121 may be formed on the coupling terminal 120, but the invention is not limited thereto. The cover layer 121 may have a plurality of trenches 124. The trench 124 may expose the first surface 110a of the dielectric substrate 110. In a subsequent step, a singulation process/dicing process may be performed along the trench 124 of the cover layer 121.

Figure 1B:
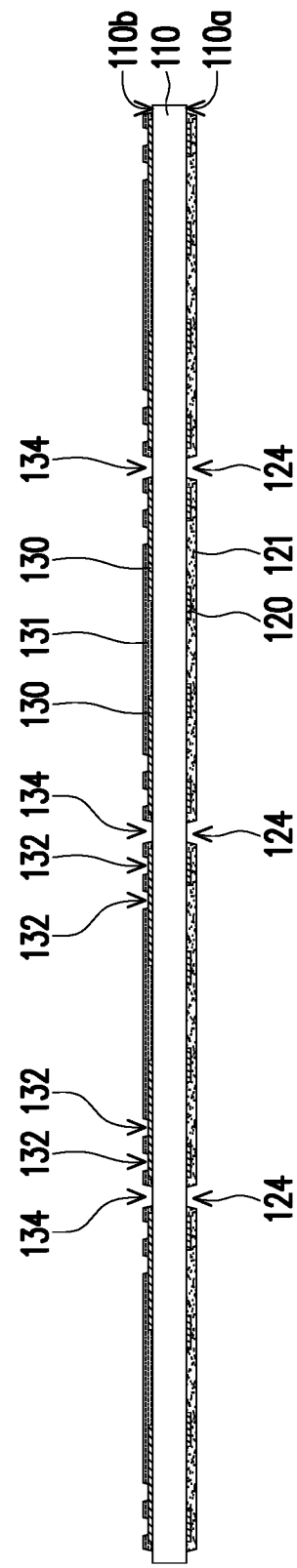

Referring to FIG. 1B, an antenna 130 is formed on the second surface 110b of the dielectric substrate 110. The antenna 130 may be formed by evaporation, sputtering, deposition, screen printing or other suitable process, and is not limited in the invention. In addition, the pattern of the antenna 130 may be adjusted according to the design requirements, and is not limited in the present invention.

It should be noted that the order of formation of the coupling terminal 120 and the antenna 130 is not limited in the present invention.

In the embodiment, the coupling end 120 may be formed first as shown in FIG. 1A, and then the structure as shown in FIG. 1A may be flipped upside down to form the antenna 130 on the second surface 110b of the dielectric substrate 110.

In an embodiment not shown, the antenna 130 may be formed on the second surface 110b of the dielectric substrate 110, and then the coupling terminal 120 may be formed on the first surface 110a of the dielectric substrate 110.

In the embodiment, the antenna 130 may be in direct contact with the second surface 110b of the dielectric substrate 110. In general, the material of the antenna 130 may be metal based on conductivity considerations.

In the embodiment, an insulating layer 131 may be formed on the antenna 130. The insulating layer 131 may have a plurality of trenches 134 and insulating openings 132. The trench 134 may expose the second surface 110b of the dielectric substrate 110. The insulating opening 132 may expose a portion of the antenna 130. In a subsequent step, a singulation process/dicing process may be performed along the trench 134 of the insulating layer 131.

Referring to FIG. 1B to FIG. 1C, after the antenna 130 is formed, a conductive connector 140 is formed on the second surface 110b of the dielectric substrate 110. The conductive connector 140 is electrically connected to the antenna 130.

In an embodiment, the conductive connector 140 may be formed, for example, by photolithography, deposition, and/or electroplating process, but the invention is not limited thereto. In another embodiment, the conductive connector 140 may be a preformed conductive post or a preformed conductive pillar.

Referring to FIG. 1B and FIG. 1D, after the antenna 130 is formed, a chip 150 is disposed on the second surface 110b of the dielectric substrate 110. The chip 150 may be a communication chip or a chip having a communication module. For example, the chip 150 may be a radio frequency integrated circuit (RFIC), but the invention is not limited thereto.

In the embodiment, the chip 150 may be disposed on the second surface 110b of the dielectric substrate 110 in such a manner that the backside surface 150b thereof faces the dielectric substrate 110.

It should be noted that the order of forming the conductive connector 140 and the disposing the chip 150 is not limited in the embodiment.

In the embodiment, the conductive connector 140 may be formed first as shown in FIG. 1C, and then the chip 150 may be disposed as shown in FIG. 1D.

In an embodiment not shown, the chip 150 may be disposed first and then the conductive connector 140 may be formed.

In the embodiment, the chip 150 has a plurality of metal bumps 151 on its active surface 150a. In a subsequent step, the metal bumps 151 may reduce damage to the active surface 150a of the chip 150.

In the embodiment, an adhesive layer 152 may be disposed on the backside surface 150b of the chip 150. The adhesive layer 152 may be, for example, a die attach film (DAF). The chip 150 may be fixed to the second surface 110b of the dielectric substrate 110 by the adhesive layer 152.

Figure 1E:
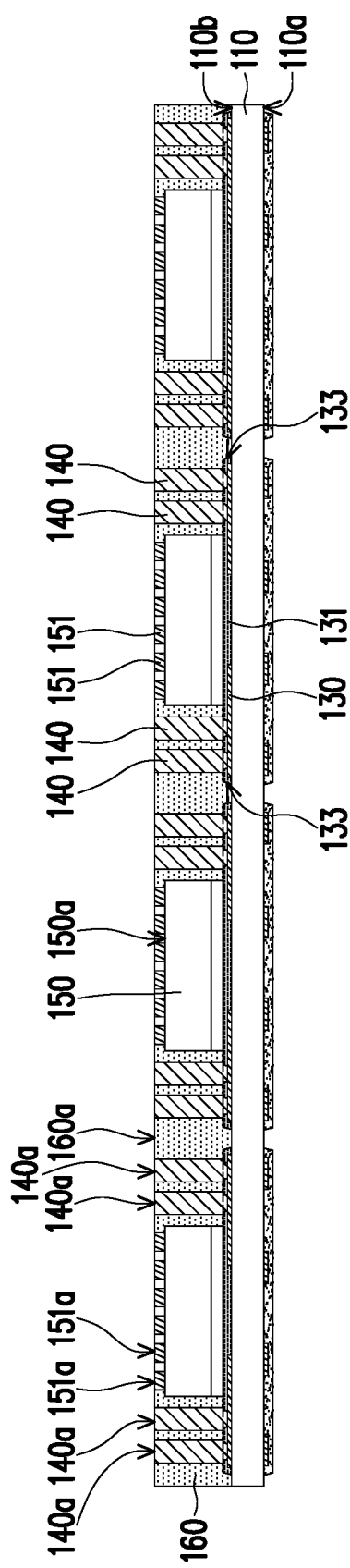

Referring to FIG. 1E, after the conductive connector 140 is formed and the chip 150 is disposed, an encapsulant 160 is formed on the second surface 110b of the dielectric substrate 110. The encapsulant 160 encapsulates the chip 150, and the encapsulant 160 exposes the conductive connector 140.

For example, a molding material may be formed on the second surface 110b of the dielectric substrate 110. Moreover, after the molding material is cured, a planarization process may be performed. After the planarization process, the encapsulant 160 may expose the conductive connector 140. In other words, the upper surface 160a of the encapsulant 160 and the upper surface 140a of the conductive connector 140 may be coplanar.

In the embodiment, the encapsulant 160 may be filled into the trench 134 (labelled in FIG. 1D) of the insulating layer 131. That is, the encapsulant 160 may directly contact the second surface 110b of the dielectric substrate 110 and the sidewall 133 of the insulating layer 131.

In the embodiment, the encapsulant 160 may further expose the metal bumps 151 on the active surface 150a of the chip 150. In general, the planarization process may be, for example, a grinding process or a polishing process. Therefore, in the aforementioned planarization process, the metal bumps 151 may reduce damage to the active surface 150a of the chip 150.

In the embodiment, the upper surface 160a of the encapsulant 160, the upper surface 140a of the conductive connector 140, and the upper surface 151a of the metal bump 151 may be coplanar. In other words, the upper surface 160a of the encapsulant 160 and the upper surface 140a of the conductive connector 140 may be not coplanar with the active surface 150a of the chip 150, the conatact pad (not shown) on the chip 150, and/or the passivation layer (not shown) chip 150.

Figure 1F:
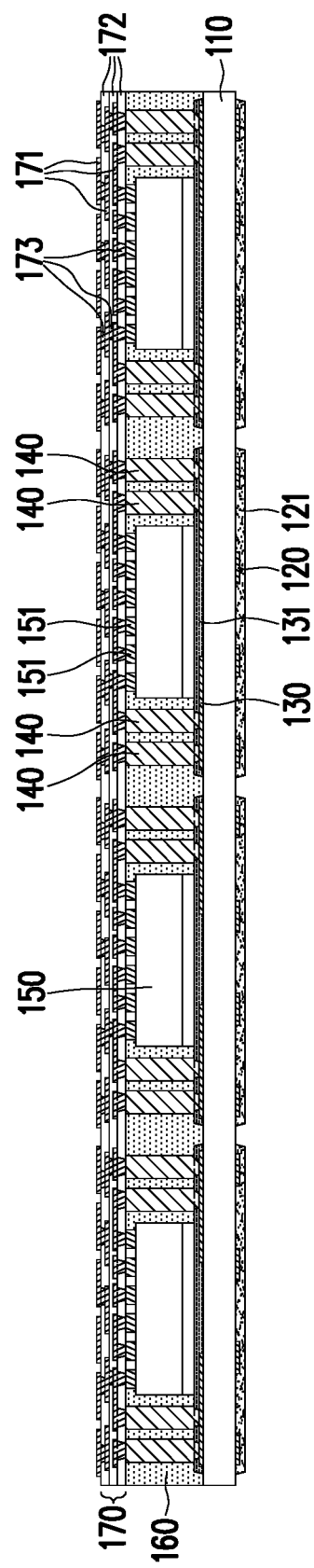

Referring to FIG. 1E to FIG. 1F, after the encapsulant 160 is formed, the circuit layer 170 is formed on the encapsulant 160. The chip 150 may be electrically connected to the conductive connector 140 by a corresponding circuit/wire/via of the circuit layer 170.

The circuit layer 170 may be formed by a general semiconductor process, and thus will not be described herein. For example, the circuit layer 170 may include at least one conductive layer 171, at least one insulating layer 172, and at least one conductive via 173. Corresponding conductive layer 171 and/or corresponding conductive via 173 may constitute corresponding circuit. In the figures, the circuits in the circuit layer 170 are only partially exemplarily shown on one of the sections, and the circuits in the circuit layer 170 may be adjusted according to design requirements. In other words, the portions of the circuits that are not connected in the figure may be electrically connected in other sections by other corresponding circuits or connectors (e.g., corresponding conductive vias or corresponding conductive layers).

In an embodiment, the circuit layer 170 may be referred to as a redistribution layer (RDL), but the invention is not limited thereto.

Figure 1G:
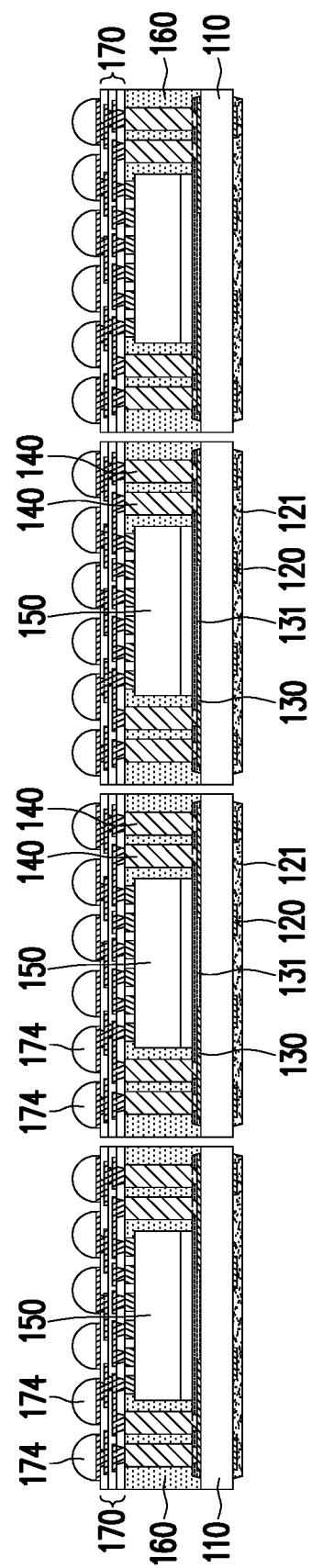
Figure 1H:
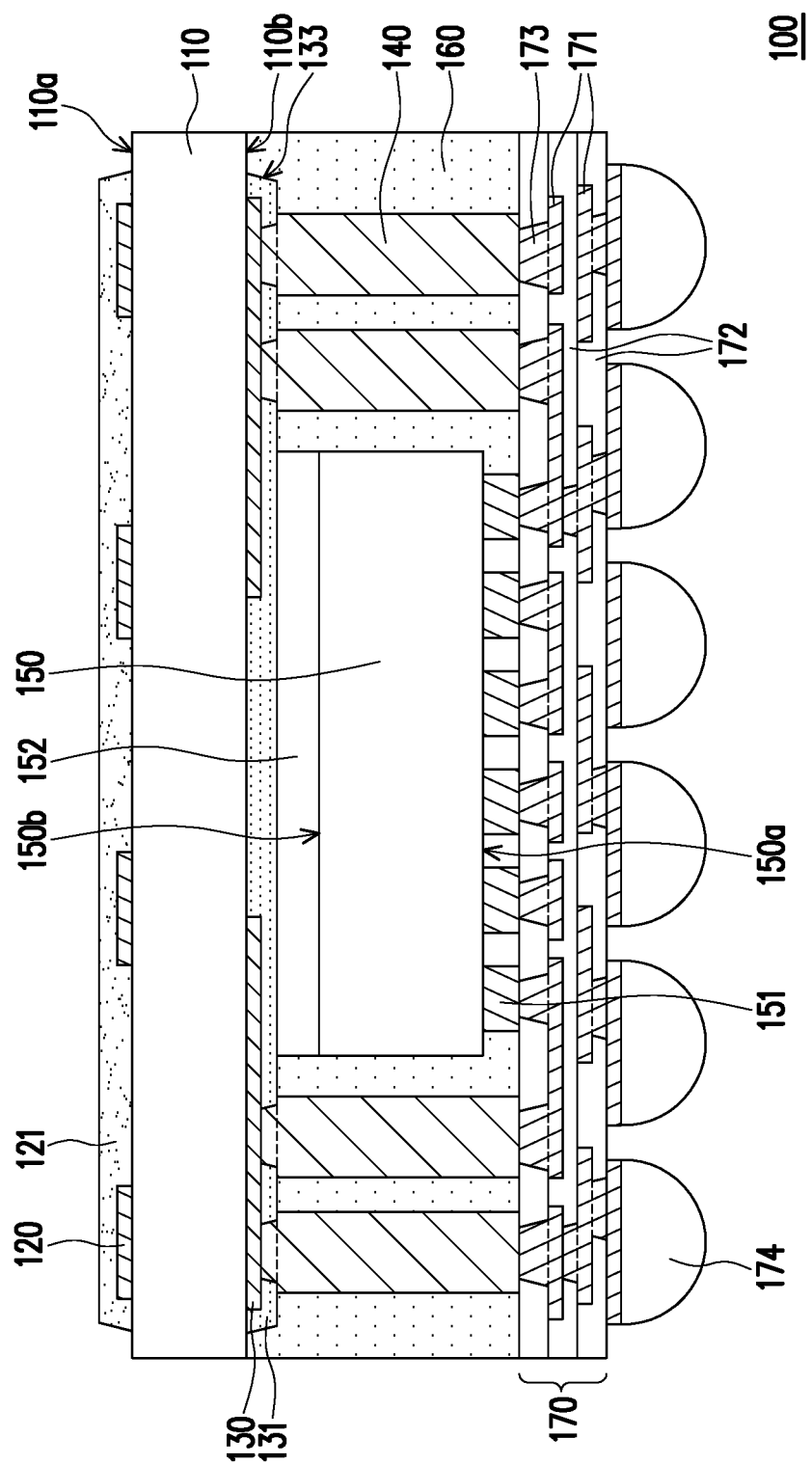
FIG. 1H is a schematic partial cross-sectional view of an integrated antenna package structure according to a first embodiment of the invention.

Referring to FIG. 1F to FIG. 1G, after the circuit layer 170 is formed, a plurality of conductive terminals 174 are formed on the circuit layer 170. The conductive terminals 174 are electrically connected to corresponding circuits in the circuit layer 170. The conductive terminals 174 may be formed, for example, by a ball placement process and/or a reflow process. For example, the conductive terminal 174 may be a solder ball.

Referring to FIG. 1F to FIG. 1G, after the circuit layer 170 is formed, a singulation process may be performed. The singulation process is performed, for example, along the trench 124 (labelled in FIG. 1D) of the protective layer 121 and the trench 134 (labelled in FIG. 1D) of the insulating layer 131. The singulation process includes, for example, a rotating blade cutting process or a laser beam cutting process.

In the embodiment, the cutting process may be performed by the trench 124 (labelled in FIG. 1D) of the protective layer 121 and the trench 134 labelled in FIG. 1D) of the insulating layer 131. As such, the possibility of peeling of the protective layer 121 and/or the insulating layer 131 from the surface of the dielectric substrate 110 may be reduced.

It should be noted that the order of forming the conductive terminals 174 and performing the singulation process is not limited in this embodiment.

It should be noted that similar symbols will be used for the singulated components/structures after the singulation process. For example, the chip 150 (labelled in FIG. 1F) may be a plurality of chips 150 after the singulation process (labelled in FIG. 1G), the circuit layer 170 (labelled in FIG. 1F) may be a plurality of circuit layers 170 after the singulation process (labelled in FIG. 1G), the encapsulant 160 (labelled in FIG. 1F) may be a plurality of encapsulants 160 after the singulation process (labelled in FIG. 1G), the antenna 130 (labelled in FIG. 1F) may be a plurality of antennas 130 after the singulation process (labelled in FIG. 1G), the insulating layer 131 (labelled in FIG. 1F) may be a plurality of insulating layers 131 after the singulation process (labelled in FIG. 1G), the plurality of conductive connectors 140 (labelled in FIG. 1F) may be a plurality of conductive connectors 140 after the singulation process (labelled in FIG. 1G), the dielectric substrate 110 (labelled in FIG. 1F) may be a plurality of dielectric substrates 110 after the singulation process (labelled in FIG. 1G), the coupling terminal 120 (labelled in FIG. 1F) may be a plurality of coupling terminals 120 after the singulation process (labelled in FIG. 1G), and the like. Other singulated elements may follow the same component symbol rules as described above and will not be described or specifically illustrated herein.

After the above manufacturing process is performed, one or more integrated antenna package structures 100 provided in the present embodiment are substantially formed. Referring to FIG. 1H, the integrated antenna package structure 100 includes a chip 150, a circuit layer 170, an encapsulant 160, an antenna 130, an insulating layer 131, a conductive connector 140, a dielectric substrate 110, and a coupling terminal 120. The circuit layer 170 is electrically connected to the chip 150. The encapsulant 160 is disposed on the circuit layer 170 and covers the chip 150. The antenna 130 is disposed on the encapsulant 160. The insulating layer 131 covers the antenna 130. The insulating layer 131 is not exposed to the outside. The conductive connector 140 penetrates through the encapsulant 160. The antenna 130 is electrically connected to the circuit layer 170 by the conductive connector 140. The dielectric substrate 110 is disposed on the encapsulant 160 and covers the antenna 130. The coupling terminal 120 is disposed on the dielectric substrate 110.

In the embodiment, the insulating layer 131 covers the antenna 130, and the encapsulant 160 covers the insulating layer 131. In this way, the antenna 130 may be better protected, and the possibility of the antenna 130 being damped or oxidized may be reduced.

In the embodiment, the dielectric substrate 110 is not completely removed during the manufacturing process of the integrated antenna package structure 100. Therefore, in the manufacturing method of the integrated antenna package structure 100, the dielectric substrate 110 may need to have good supportability, physical stability, and chemical stability. For example, in a common deposition process or reflow process, there may be a corresponding heating or cooling step; in a common lithography process or electroplating process, a corresponding acid, base or organic solvent may be used. Therefore, the material of the dielectric substrate 110 may be an inorganic material having a relatively stable physical property or chemical property.

In the embodiment, the glass transition temperature ($T_g$) of the dielectric substrate 110 is greater than the melting point of the conductive terminal 174.

In the antenna integrated package structure 100, a dielectric substrate 110 is disposed between the coupling terminal 120 and the antenna 130. Therefore, the coupling terminal 120 and the antenna 130 are structurally separated from each other. Moreover, the electromagnetic signal may be transmitted between the coupling terminal 120 and the antenna 130 by inductive coupling. In general, the dielectric substrate 110 has a dielectric constant less than or equal to 4 and greater than or equal to 3. Moreover, the dissipation factor of the dielectric substrate 110 at a frequency commonly used in the general communication field (e.g., 28 GHz, 39 GHz, 77 GHz, 79 GHz, or other suitable range of 20 to 80 GHz) may be less than or equal to 0.005, but the invention is not limited thereto.

In an embodiment, the dielectric substrate 110 is a glass substrate, a ceramic substrate, or a quartz substrate. In an embodiment, the dissipation factor of a glass substrate at frequencies commonly used in the general communication field may be less than or equal to 0.005.

Figure 2A:
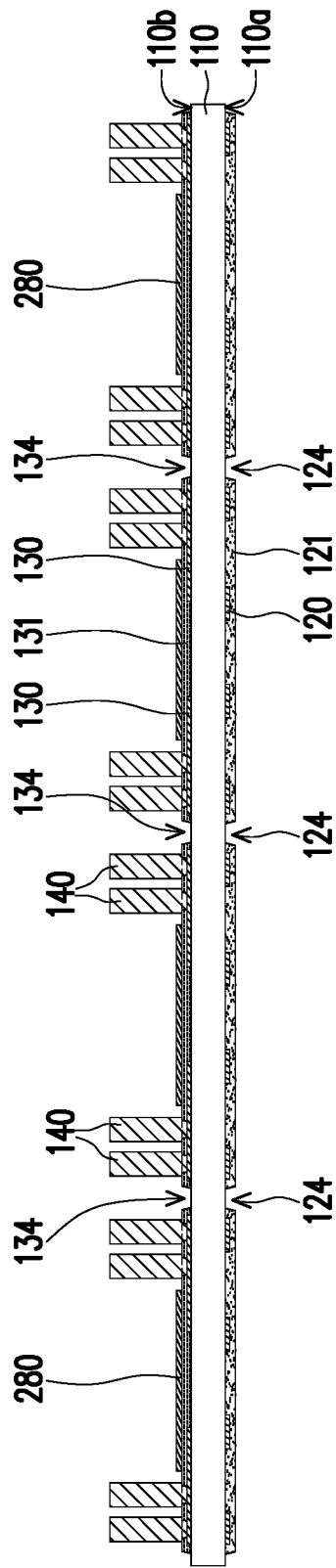
FIG. 2A is a schematic partial cross-sectional view of a partial manufacturing method of an integrated antenna package structure according to a second embodiment of the invention.
Figure 2B:
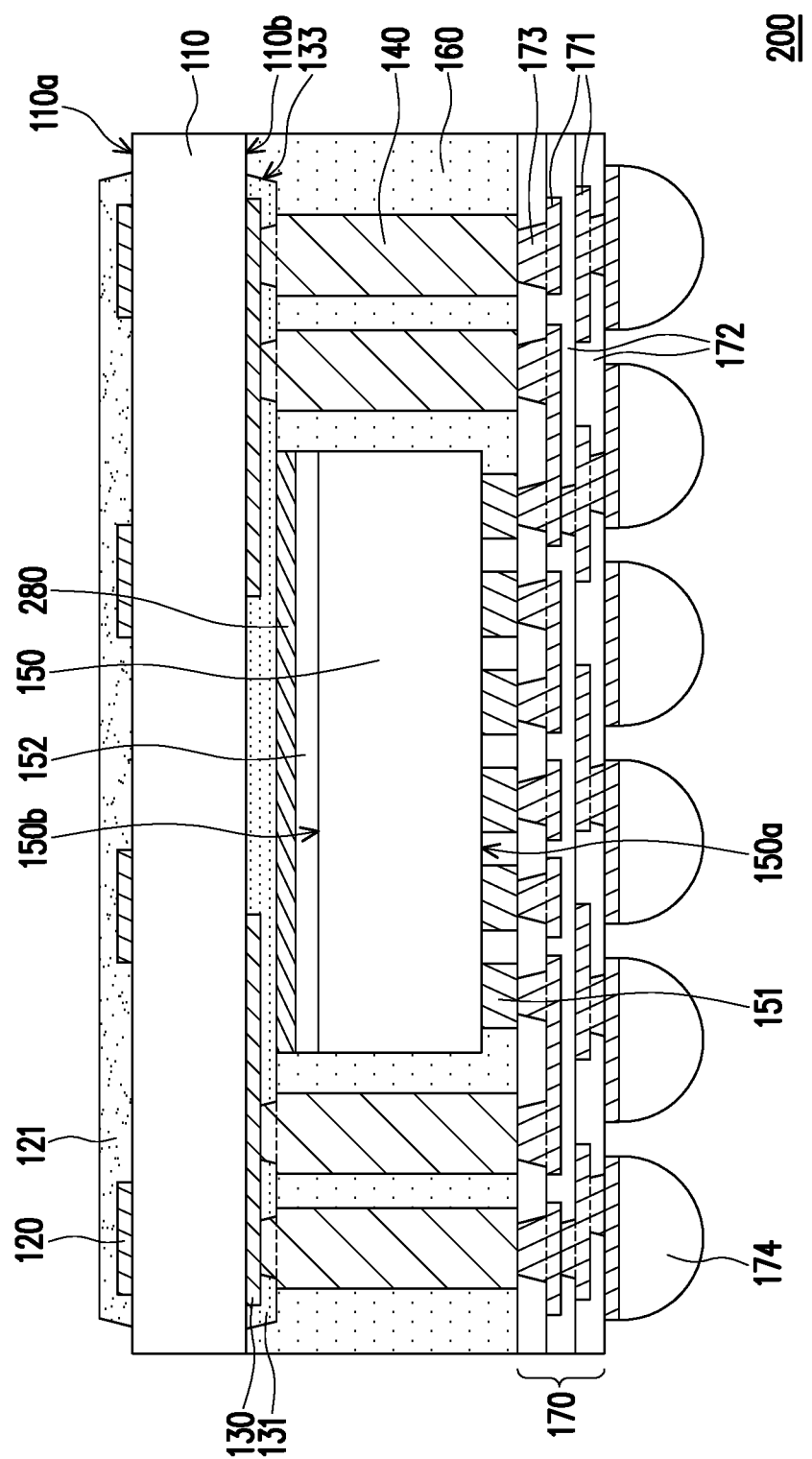
FIG. 2B is a schematic partial cross-sectional view of an integrated antenna package structure according to a second embodiment of the invention.

FIG. 2A to FIG. 2B are schematic partial cross-sectional views of a partial manufacturing method of an integrated antenna package structure according to a second embodiment of the invention. FIG. 2B is a schematic partial cross-sectional view of an integrated antenna package structure according to a second embodiment of the invention. In the embodiment, the manufacturing method of the integrated antenna package structure 200 of the present embodiment is similar to the manufacturing method of the integrated antenna package structure 100 of the first embodiment, and similar elements are denoted by the same reference numerals, and have similar functions, materials, or formation modes, and the description is omitted. Specifically, FIG. 2A may be a partial cross-sectional view showing a partial manufacturing method of an integrated antenna package structure following the steps of FIG. 1B.

Following the step of FIG. 1B, referring to FIG. 2A, in the embodiment, after the antenna 130 is formed, the conductive connector 140 and the shielding layer 280 are formed on the second surface 110b of the dielectric substrate 110. It should be noted that the order of formation of the conductive connector 140 and the shielding layer 280 is not limited in the present invention.

In an embodiment, the shielding layer 280 may be formed, for example, by lithography process and deposition process. In an embodiment, the shielding layer 280 may be formed, for example, by deposition process, lithography process, and etching process. In another embodiment, the shielding layer 280 may be a conductive patch or a conductive paste. The manner of forming the shielding layer 280 is not limited in the present invention.

After forming the shielding layer 280, the chip 150 is disposed on the shielding layer 280 similar to the step described in FIG. 1D. It should be noted that the order of forming the conductive connector 140 and the disposing the chip 150 is not limited in the embodiment.

Thereafter, similar to the steps illustrated in FIGS. 1D to 1G, one or more integrated antenna package structures 200 provided in the present embodiment are substantially formed.

Referring to FIG. 1H and FIG. 2B, the integrated antenna package structure 200 of the present embodiment is similar to the integrated antenna package structure 100 of the first embodiment, and similar elements are denoted by the same reference numerals, and have similar functions, and the description is omitted. Referring to FIG. 2B, the integrated antenna package structure 200 includes a chip 150, a circuit layer 170, an encapsulant 160, an antenna 130, an insulating layer 131, a conductive connector 140, a dielectric substrate 110, a coupling terminal 120, and a shielding layer 280. The shielding layer 280 is disposed between the dielectric substrate 110 and the chip 150.

In the embodiment, the shielding layer 280 may be disposed between the antenna 130 and the chip 150. The shielding layer 280 may reduce signal interference between the antenna 130 and the chip 150.

In an embodiment, the shielding layer 280 may be grounded, but the invention is not limited thereto.

FIG. 3A to FIG. 3I are schematic partial cross-sectional views of a partial manufacturing method of an integrated antenna package structure according to a third embodiment of the invention. FIG. 3J is a schematic partial cross-sectional view of an integrated antenna package structure according to a third embodiment of the invention.

Figure 3A:
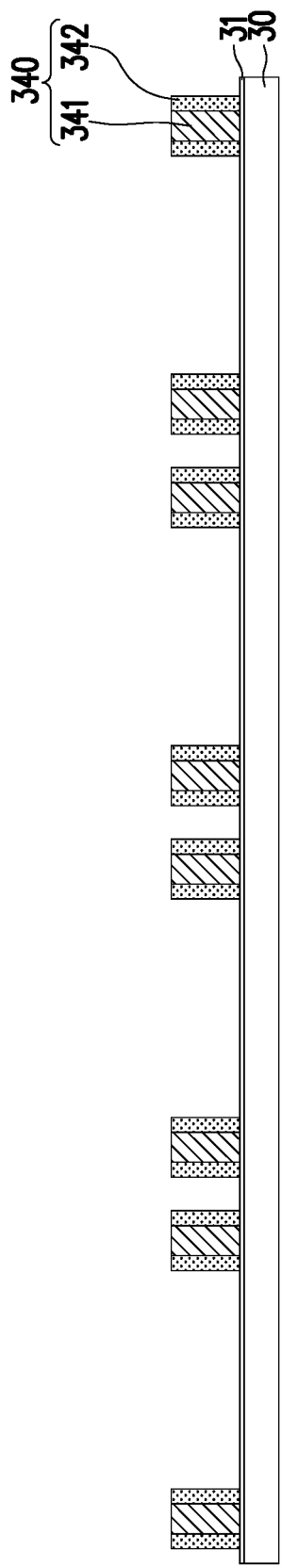

Referring to FIG. 3A, a carrier 30 is provided. In the embodiment, the carrier 30 is not particularly limited as long as the carrier 30 may be adapted to be carried an element disposed on or a film layer disposed on, and may be stably present in a temperature or temperature difference in a subsequent process.

In the embodiment, a release film 31 may be disposed on the carrier 30. In a subsequent process, the release film 31 may make the carrier 30 easier to separate from the component or film layer disposed thereon.

Referring to FIG. 3A, a conductive connector 340 is formed on the carrier 30.

In the embodiment, the conductive connector 340 may be a preformed conductive post or a preformed conductive pillar, but the invention is not limited thereto.

In the embodiment, the conductive connector 340 may include a conductive core layer 341 and an insulating shell layer 342. The insulating shell layer 342 surrounds the conductive core layer 341. For example, the conductive connector 340 may be, for example, a printed circuit board, the insulating shell layer 342 may be, for example, a prepreg layer of the printed circuit board, and the conductive core layer 341 may, for example, a plated-through hole (PTH) of the printed circuit board.

Figure 3B:
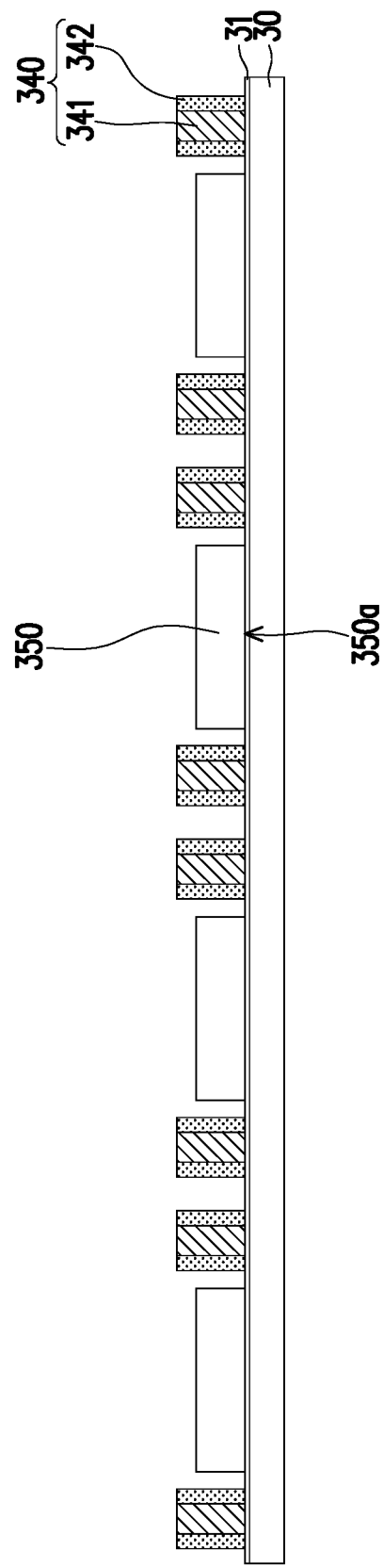

Referring to FIG. 3B, a chip 350 is disposed on the carrier 30. The chip 350 may be a communication chip or a chip having a communication module. For example, the chip 150 may be a RFIC, but the invention is not limited thereto.

In the embodiment, the chip 350 may be disposed on the carrier 30 in such a manner that the active surface 350a thereof faces the carrier 30.

It should be noted that the order of forming/disposing the conductive connector 340 and the disposing the chip 350 is not limited in the embodiment.

In the embodiment, the conductive connector 340 may be formed/disposed first as shown in FIG. 3A, and then the chip 350 may be disposed as shown in FIG. 3B.

In an embodiment not shown, the chip 350 may be disposed first and then the conductive connector 340 may be formed/disposed.

Figure 3C:
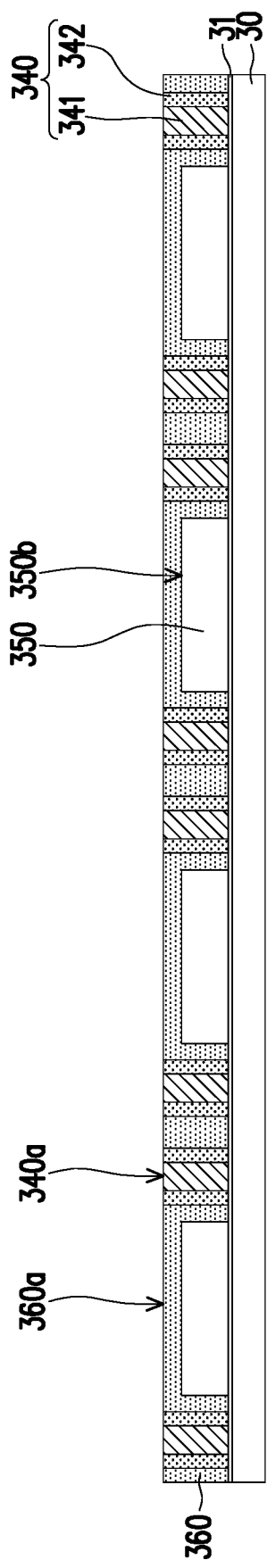

Referring to FIG. 3C, after the conductive connector 340 is formed/disposed and the chip 350 is disposed, an encapsulant 360 is formed on the carrier 30. The encapsulant 360 covers the backside surface 350b of the chip 350, and the encapsulant 360 exposes the conductive connector 340.

For example, a molding material may be formed on the carrier 30. Moreover, after the molding material is cured, a planarization process may be performed. The encapsulant 360 may expose the conductive connector 340. In other words, the upper surface 360a of the encapsulant 360 and the upper surface 340a of the conductive connector 340 may be coplanar.

Figure 3D:
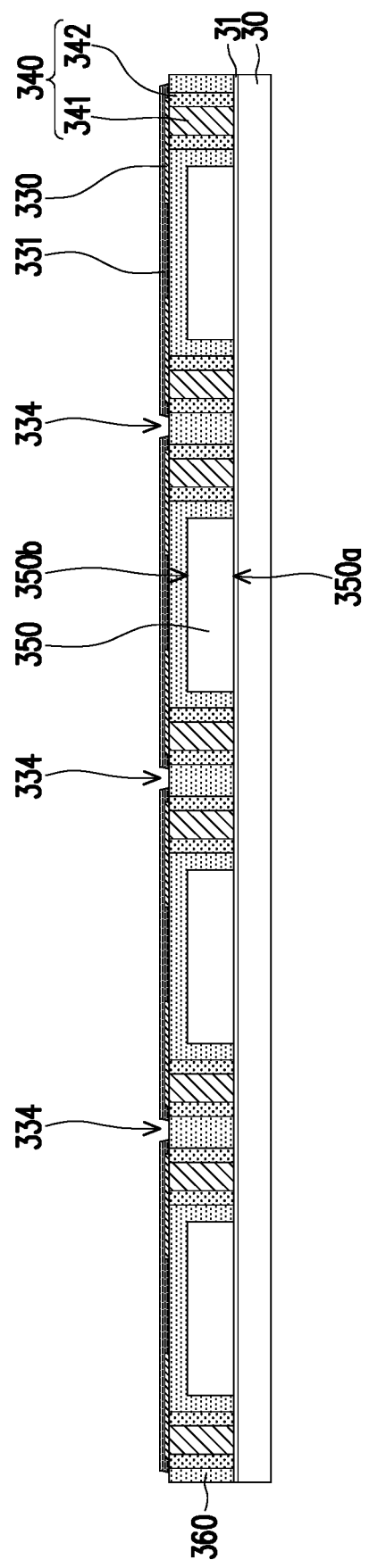

Referring to FIG. 3C to FIG. 3D, after the encapsulant 360 is formed, the antenna 330 is formed on the encapsulant 360. The antenna 330 is electrically connected to the conductive connector 340. The antenna 330 may be formed by evaporation, sputtering, deposition, screen printing or other suitable process, and is not limited in the invention. In addition, the pattern of the antenna 330 may be adjusted according to the design requirements, and is not limited in the present invention.

Referring to FIG. 3D, after the antenna 330 is formed, an insulating layer 331 may be formed on the antenna 330. The insulating layer 331 may have a plurality of trenches 334. The trench 334 may expose the encapsulant 360. In a subsequent step, a singulation process/dicing process may be performed along the trench 334 of the insulating layer 331.

Figure 3E:
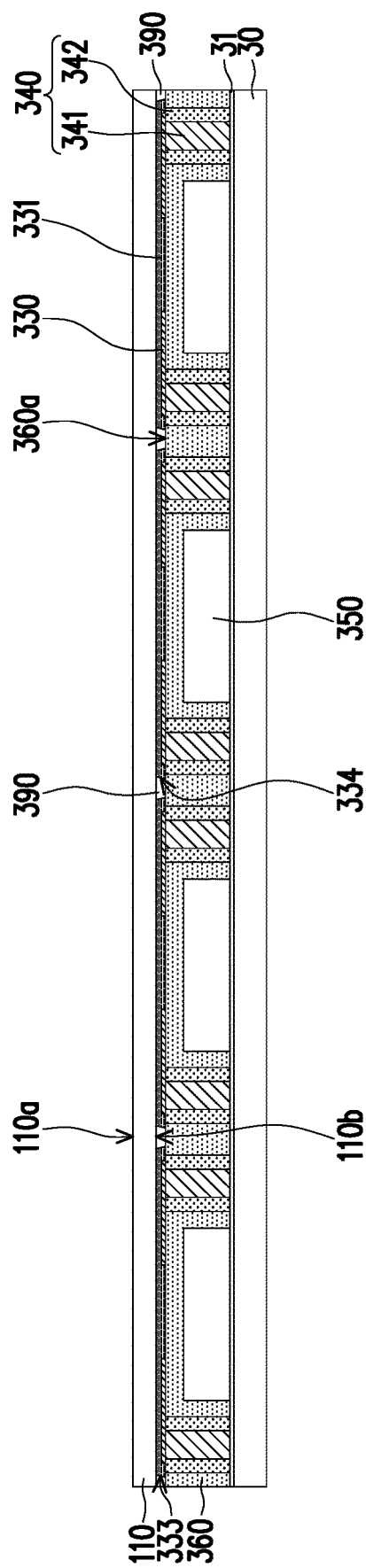

Referring to FIG. 3D to FIG. 3E, after the insulating layer 331 is formed, the dielectric substrate 110 is disposed on the antenna 330.

In the embodiment, an adhesive layer 390 may be formed on the encapsulant 360. The adhesive layer 390 may be filled into trench 334 (labelled in FIG. 3D) of insulating layer 331. That is, the adhesive layer 390 may cover the sidewall 333 (labelled in FIG. 3E) of the insulating layer 331, the upper surface 360a of the encapsulant 360, and the second surface 110b of the dielectric substrate 110. In other words, the adhesive layer 390 may be filled between at least two of the dielectric substrate 110, the insulating layer 331 and the encapsulant 360. As such, the dielectric substrate 110 may be fixed on the insulating layer 331 and/or the encapsulant 360.

In the embodiment, the antenna 330 may not be in direct contact with the second surface 110b of the dielectric substrate 110.

Figure 3F:
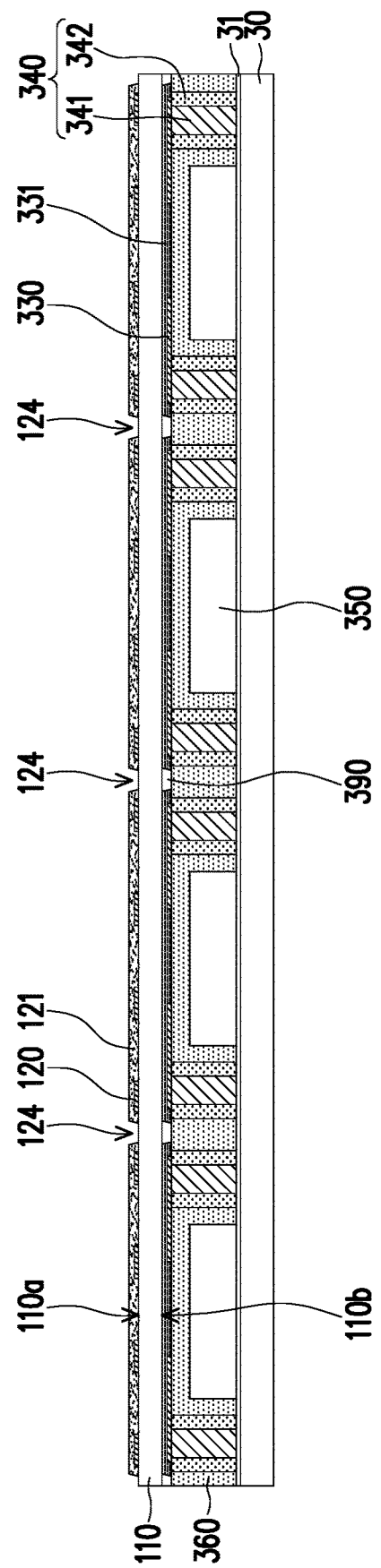

Referring to FIG. 3E to FIG. 3F, a coupling terminal 120 is formed on the first surface 110a of the dielectric substrate 110. It should be noted that the order of forming the coupling terminal 120 and the disposing the dielectric substrate 110 on the antenna 330 is not limited in the embodiment.

In the embodiment, the dielectric substrate 110 may be first disposed on the antenna 330 as shown in FIG. 3E, and then the coupling end 120 is formed on the first surface 110a of the dielectric substrate 110 as shown in FIG. 3F.

In an embodiment not shown, the coupling end 120 may be formed on the first surface 110a of the dielectric substrate 110, and then the dielectric substrate 110 is disposed on the antenna 330.

Referring to FIG. 3F to FIG. 3G, after the dielectric substrate 110 is disposed, the carrier 30 (shown in FIG. 3F) and/or the release film 31 (shown in FIG. 3F; if any) are removed. After the carrier 30 and the release film 31 (if any) are removed, the conductive connectors 340 may be exposed.

In the embodiment, after removing the carrier 30 and the release film 31 (if any), the active surface 350a of the chip 350 may be further exposed.

It should be noted that the order of forming the coupling terminal 120 and removing the carrier 30 is not limited in the embodiment.

In the embodiment, the coupling terminal 120 may be first formed on the first surface 110a of the dielectric substrate 110 as shown in FIG. 3F, and then the carrier 30 may be removed as shown in FIG. 3G.

In an embodiment not shown, the carrier 30 may be removed first, and then the coupling terminal 120 is formed on the first surface 110a of the dielectric substrate 110.

Referring to FIG. 3G to FIG. 3H, after the carrier 30 (shown in FIG. 3F) is removed, the circuit layer 170 is formed. The chip 350 may be electrically connected to the conductive connector 340 by a corresponding circuit/wire/via of the circuit layer 170.

Figure 3I:
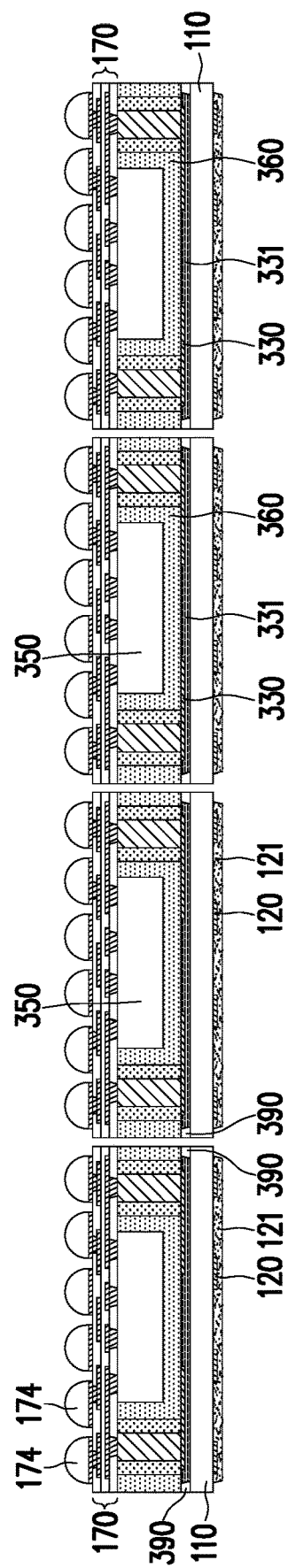
Figure 3J:
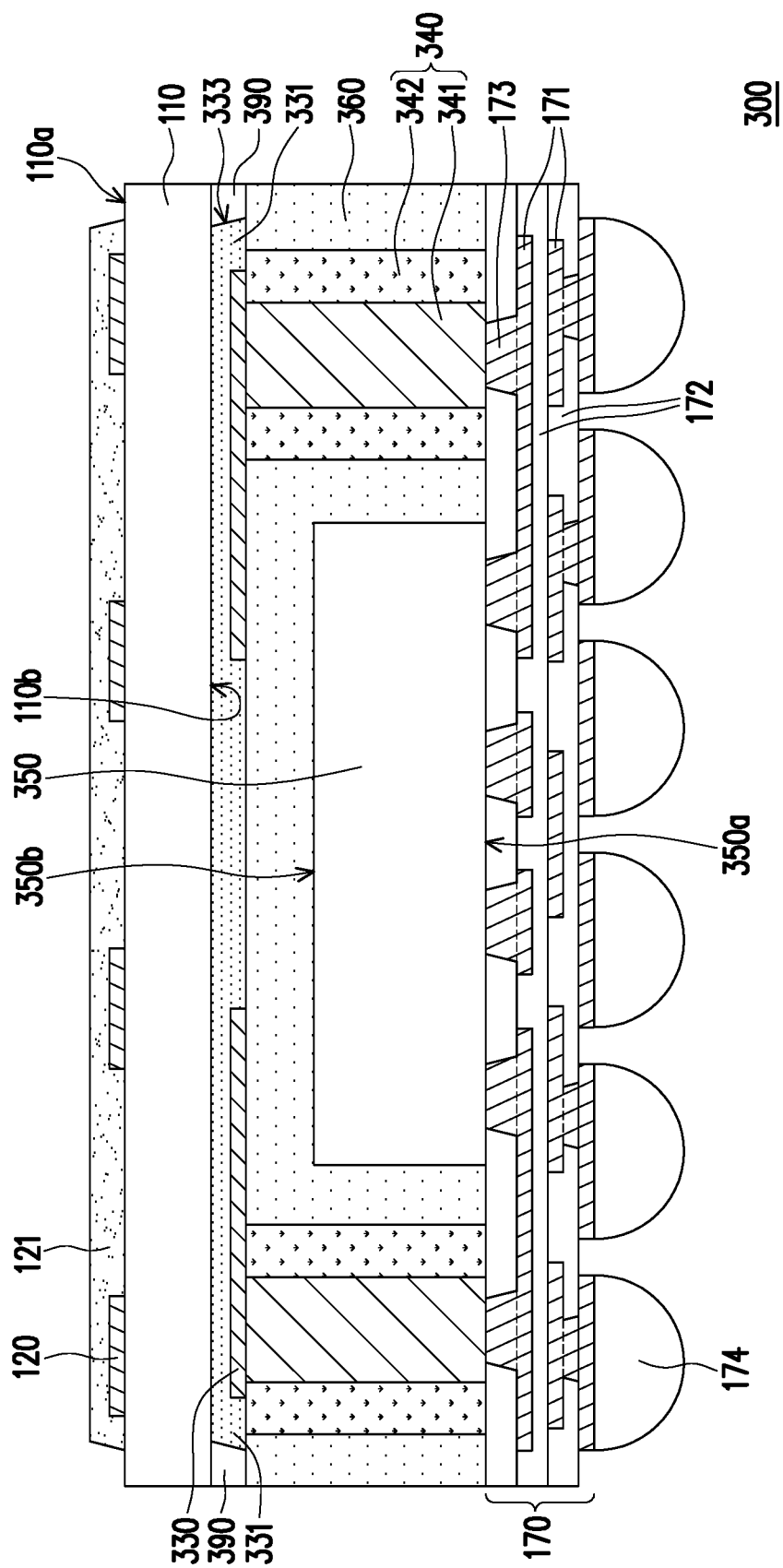
FIG. 3J is a schematic partial cross-sectional view of an integrated antenna package structure according to a third embodiment of the invention.

Referring to FIG. 3H to FIG. 3I, after the circuit layer 170 is formed, a plurality of conductive terminals 174 are formed on the circuit layer 170. The conductive terminals 174 are electrically connected to corresponding circuits in the circuit layer 170.

Referring to FIG. 3H to FIG. 3I, after the circuit layer 170 is formed, a singulation process may be performed. The singulation process is performed, for example, along the trench 124 (labelled in FIG. 3H) of the protective layer 121 and the trench 334 (labelled in FIG. 3D) of the insulating layer 331. The singulation process includes, for example, a rotating blade cutting process or a laser beam cutting process.

It should be noted that the order of forming the conductive terminals 174 and performing the singulation process is not limited in this embodiment.

It should be noted that similar symbols will be used for the singulated components/structures after the singulation process. For example, the chip 350 (labelled in FIG. 3I) may be a plurality of chips 350 after the singulation process (labelled in FIG. 3J), the circuit layer 170 (labelled in FIG. 3I) may be a plurality of circuit layers 170 after the singulation process (labelled in FIG. 3J), the encapsulant 360 (labelled in FIG. 3I) may be a plurality of encapsulants 360 after the singulation process (labelled in FIG. 3J), the antenna 330 (labelled in FIG. 3I) may be a plurality of antennas 330 after the singulation process (labelled in FIG. 3J), the insulating layer 331 (labelled in FIG. 3I) may be a plurality of insulating layers 331 after the singulation process (labelled in FIG. 3J), the plurality of conductive connectors 340 (labelled in FIG. 3I) may be a plurality of conductive connectors 340 after the singulation process (labelled in FIG. 3J), the dielectric substrate 110 (labelled in FIG. 3I) may be a plurality of dielectric substrates 110 after the singulation process (labelled in FIG. 3J), the coupling terminal 120 (labelled in FIG. 3I) may be a plurality of coupling terminals 120 after the singulation process (labelled in FIG. 3J), and the like. Other singulated elements may be follow the same component symbol rules as described above and will not be described or specifically illustrated herein.

After the above manufacturing process is performed, one or more integrated antenna package structures 300 provided in the present embodiment are substantially formed. Referring to FIG. 3J, the integrated antenna package structure 300 includes a chip 350, a circuit layer 170, an encapsulant 360, an antenna 330, an insulating layer 331, a conductive connector 340, a dielectric substrate 110, and a coupling terminal 120. The circuit layer 170 is electrically connected to the chip 350. The encapsulant 360 is disposed on the circuit layer 170 and covers the chip 350. The antenna 330 is disposed on the encapsulant 360. The insulating layer 331 covers the antenna 330. The insulating layer 331 is not exposed to the outside. The conductive connector 340 penetrates through the encapsulant 360. The antenna 330 is electrically connected to the circuit layer 170 by the conductive connector 340. The dielectric substrate 110 is disposed on the encapsulant 360 and covers the antenna 330. The coupling terminal 120 is disposed on the dielectric substrate 110.

In the embodiment, the integrated antenna package structure 300 may further include an adhesive layer 390. The insulating layer 331 covers the antenna 330, and the adhesive layer 390 covers the sidewall 333 of the insulating layer 331. In this way, the antenna 330 may be better protected, and the possibility of the antenna 330 being damped or oxidized may be reduced.

Figure 4A:
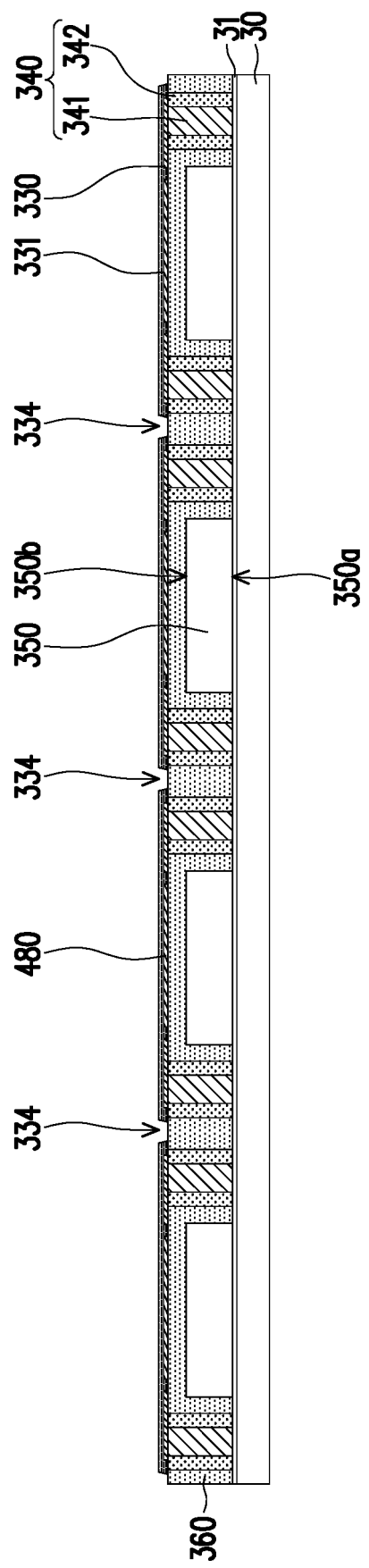
FIG. 4A is a schematic partial cross-sectional view of a partial manufacturing method of an integrated antenna package structure according to a fourth embodiment of the invention.
Figure 4B:
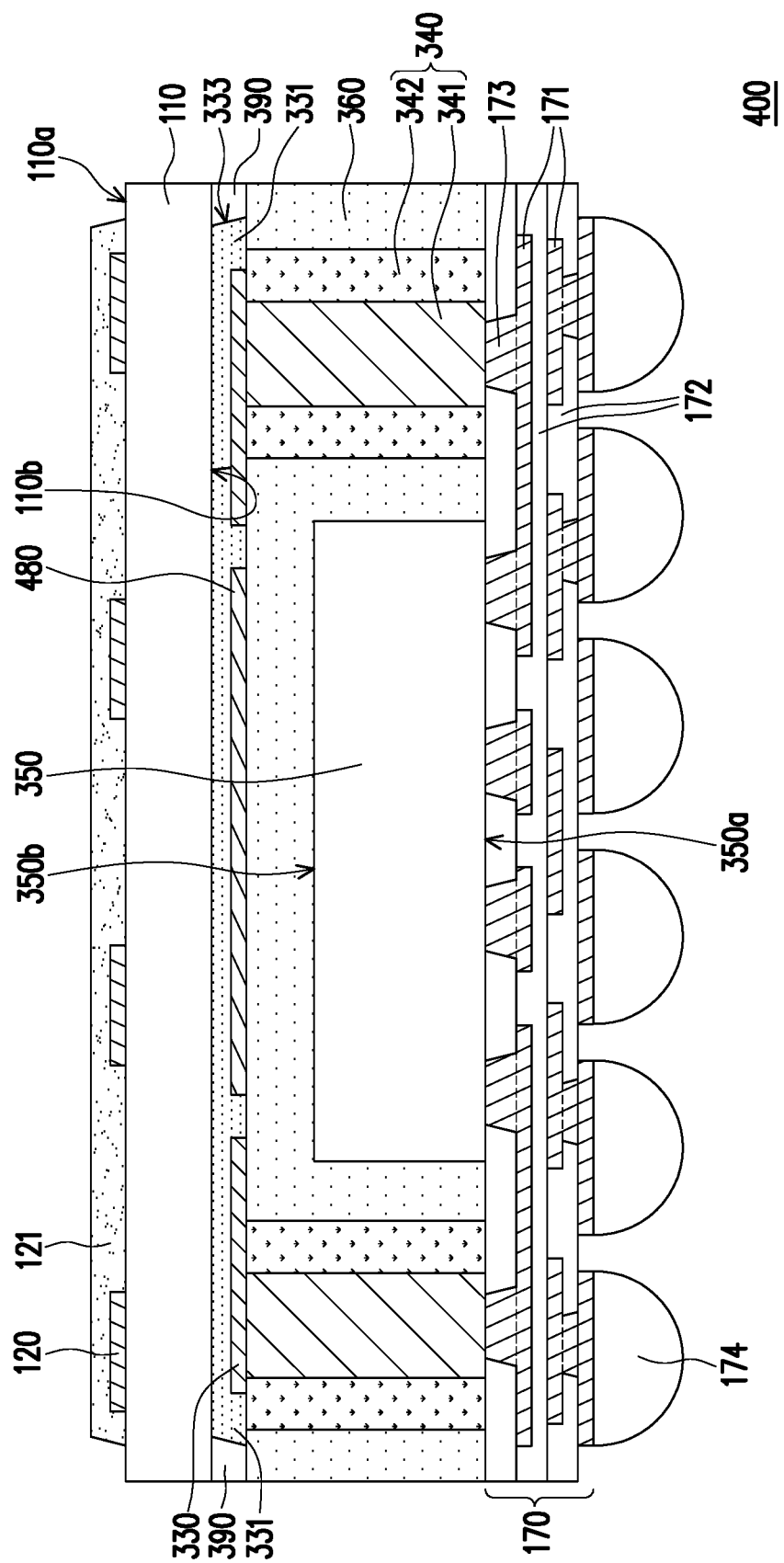
FIG. 4B is a schematic partial cross-sectional view of an integrated antenna package structure according to a fourth embodiment of the invention.

FIG. 4A is a schematic partial cross-sectional view of a partial manufacturing method of an integrated antenna package structure according to a fourth embodiment of the invention. FIG. 4B is a schematic partial cross-sectional view of an integrated antenna package structure according to a fourth embodiment of the invention. In the embodiment, the manufacturing method of the integrated antenna package structure 400 of the present embodiment is similar to the manufacturing method of the integrated antenna package structure 300 of the third embodiment, and similar elements are denoted by the same reference numerals, and have similar functions, materials, or formation modes, and the description is omitted. Specifically, FIG. 4A may be a partial cross-sectional view showing a partial manufacturing method of an integrated antenna package structure following the steps of FIG. 3C.

Referring to FIG. 3C and FIG. 4A, after the encapsulant 360 is formed, the antenna 330 and the shielding layer 480 are formed on the encapsulant 360. The material and formation manner of the antenna 330 may be the same as or similar to the material and formation manner of the shielding layer 480.

After the antenna 330 and the shielding layer 480 are formed, an insulating layer 331 may be formed on the antenna 330 and the shielding layer 480.

Thereafter, similar to the steps illustrated in FIGS. 3D to 3I, one or more integrated antenna package structures 400 provided in the present embodiment are substantially formed.

Referring to FIG. 3J and FIG. 4B, the integrated antenna package structure 400 of the present embodiment is similar to the integrated antenna package structure 300 of the first embodiment, and similar elements are denoted by the same reference numerals, and have similar functions, and the description is omitted. Referring to FIG. 4B, the integrated antenna package structure 400 includes a chip 350, a circuit layer 170, an encapsulant 360, an antenna 330, an insulating layer 331, a conductive connector 340, a dielectric substrate 110, a coupling terminal 120, and a shielding layer 480. The shielding layer 480 is disposed between the dielectric substrate 110 and the chip 350. The shielding layer 480 may reduce signal interference between the antenna 130 and the chip 350.

In an embodiment, the shielding layer 480 may be grounded, but the invention is not limited thereto.

In summary, the integrated antenna package structure a manufacturing method thereof may have a smaller volume and a higher yield.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An integrated antenna package structure comprising:
a chip;
a circuit layer, electrically connected to the chip;
an encapsulant, disposed on the circuit layer and covering the chip;
an antenna, disposed on the encapsulant;
an insulating layer, covering the antenna, wherein the insulating layer is not exposed to the outside;
a conductive connector, penetrating through the encapsulant, wherein the antenna is electrically connected to the circuit layer by the conductive connector;
a dielectric substrate, disposed on the encapsulant and covering the antenna; and
a coupling terminal, disposed on the dielectric substrate, wherein:
a dielectric constant of the dielectric substrate is less than or equal to 4 and greater than or equal to 3; and
a dissipation factor of the dielectric substrate at an electromagnetic wave frequency of 20 to 80 GHz is less than or equal to 0.005.

2. The integrated antenna package structure of claim 1, further comprising:
a plurality of conductive terminals, electrically connected to the circuit layer, wherein the circuit layer is disposed between the plurality of conductive terminals and the chip, and a glass transition temperature of the dielectric substrate is greater than a melting point temperature of the plurality of conductive terminals.

3. The integrated antenna package structure of claim 1, wherein the dielectric substrate is a homogeneous material.

4. The integrated antenna package structure of claim 1, wherein the dielectric substrate is a glass substrate, a ceramic substrate, or a quartz substrate.

5. The integrated antenna package structure of claim 1, wherein the antenna and the coupling terminal are in direct contact with opposite surfaces of the dielectric substrate respectively.

6. The integrated antenna package structure of claim 1, wherein the encapsulant directly contacts the dielectric substrate.

7. The integrated antenna package structure of claim 1, wherein the conductive connector comprises:
a conductive core layer, electrically connected to the antenna and the circuit layer; and
an insulating shell layer, surrounding the conductive core layer.

8. The integrated antenna package structure of claim 1, further comprising:

a shielding layer, disposed between the dielectric substrate and the chip.

9. The integrated antenna package structure of claim 8, wherein the shielding layer is further disposed between the antenna and the chip.

10. A manufacturing method of an integrated antenna package structure, comprising:
   providing a dielectric substrate, having a first surface and a second surface opposite to the first surface;
   forming a coupling terminal on the first surface of the dielectric substrate;
   forming an antenna on the second surface of the dielectric substrate;
   forming a conductive connector on the second surface of the dielectric substrate, wherein the conductive connector is electrically connected to the antenna;
   disposing a chip on the second surface of the dielectric substrate;
   forming an encapsulant on the second surface of the dielectric substrate, wherein the encapsulant covers the chip; and
   forming a circuit layer on the encapsulant, wherein the circuit layer is electrically connected to the chip and the conductive connector, wherein:
      a dielectric constant of the dielectric substrate is less than or equal to 4 and greater than or equal to 3; and
      a dissipation factor of the dielectric substrate at an electromagnetic wave frequency of 20 to 80 GHz is less than or equal to 0.005.

11. The manufacturing method of the integrated antenna package structure of claim 10, further comprising:
   forming a plurality of conductive terminals on the circuit layer, wherein a glass transition temperature of the dielectric substrate is greater than a melting point temperature of the plurality of conductive terminals.

12. The manufacturing method of the integrated antenna package structure of claim 10, further comprising:
   forming an insulating layer, covering a portion of the antenna, wherein after the step of forming the encapsulant, the encapsulant covers the sidewall of the insulating layer.

13. The manufacturing method of the integrated antenna package structure of claim 10, further comprising:
   forming a shielding layer on the second surface of the dielectric substrate, wherein the chip is disposed on the shielding layer.

14. The manufacturing method of the integrated antenna package structure of claim 13, wherein the shielding layer is further disposed on the antenna.

15. A manufacturing method of an integrated antenna package structure, comprising:
   providing a carrier;
   forming a conductive connector on the carrier;
   disposing a chip on the carrier;
   forming an encapsulant on the carrier, wherein the encapsulant covers the chip and exposes the conductive connector;
   forming an antenna on the encapsulant and electrically connecting to the conductive connector;
   disposing a dielectric substrate on the antenna;
   forming a coupling terminal on the dielectric substrate;
   removing the carrier after the step of disposing the dielectric substrate; and
   forming a circuit layer electrically connected to the chip and the conductive connector after the step of removing the carrier, wherein:
      a dielectric constant of the dielectric substrate is less than or equal to 4 and greater than or equal to 3; and
      a dissipation factor of the dielectric substrate at an electromagnetic wave frequency of 20 to 80 GHz is less than or equal to 0.005.

16. The manufacturing method of the integrated antenna package structure of claim 15, further comprising:
   forming a plurality of conductive terminals on the circuit layer, wherein a glass transition temperature of the dielectric substrate is greater than a melting point temperature of the plurality of conductive terminals.

17. The manufacturing method of the integrated antenna package structure of claim 15, further comprising:
   forming an insulating layer on the encapsulant and covering the antenna; and
   forming an adhesive layer on the encapsulant and covering a sidewall of the insulating layer.

18. The manufacturing method of the integrated antenna package structure of claim 15, further comprising:
   forming a shielding layer on the sealing body, and wherein the chip overlaps the shielding layer.

19. The manufacturing method of the integrated antenna package structure of claim 15, wherein the conductive connector comprises:
   a conductive core layer; and
   an insulating shell layer, surrounding the conductive core layer.

* * * * *